United States Patent [19]
Lee et al.

[11] Patent Number: 5,700,729
[45] Date of Patent: Dec. 23, 1997

[54] MASKED-GATE MOS S/D IMPLANTATION

[75] Inventors: Jian-Huei Lee; Ying-Tzu Yen; Ping-Hui Peng, all of Hsin-Chu, Taiwan

[73] Assignee: Taiwan Semiconductor Manufacturing Company, Ltd., Hsinchu, Taiwan

[21] Appl. No.: 679,920

[22] Filed: Jul. 15, 1996

[51] Int. Cl.⁶ .................................................. H01L 21/8238
[52] U.S. Cl. ............................................ 438/230; 438/551
[58] Field of Search .................................... 437/29, 41, 44, 437/147, 148, 984

[56] References Cited

U.S. PATENT DOCUMENTS

| | | | |
|---|---|---|---|
| 5,200,028 | 4/1993 | Tatsumi | 156/656 |
| 5,354,700 | 10/1994 | Huang et al. | 437/40 |
| 5,385,857 | 1/1995 | Solo de Zaldivar | 437/44 |
| 5,393,682 | 2/1995 | Liu | 437/41 |
| 5,534,449 | 7/1996 | Dennison et al. | 437/44 |

*Primary Examiner*—Chandra Chaudhari
*Attorney, Agent, or Firm*—George O. Saile; Stephen B. Ackerman

[57] ABSTRACT

The problem of how to prevent trapping charge during high energy ion implantation, as part of a PLDD, NLDD, PS/D, and NS/D manufacturing process, has been solved through use of a protective cap of photoresist which is applied to the gate prior to the high energy ion implantation. Said protective cap is readily removed after ion implantation.

23 Claims, 4 Drawing Sheets

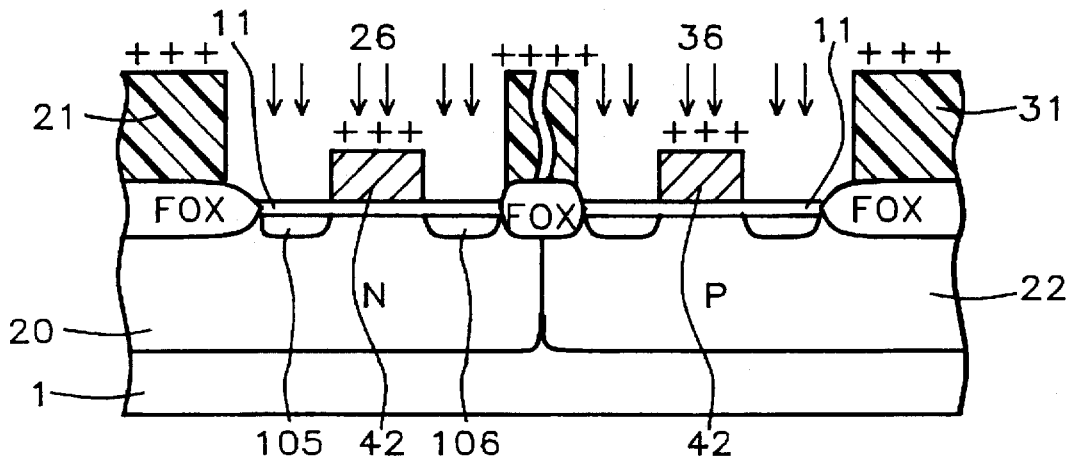
FIG. 1a – Prior Art
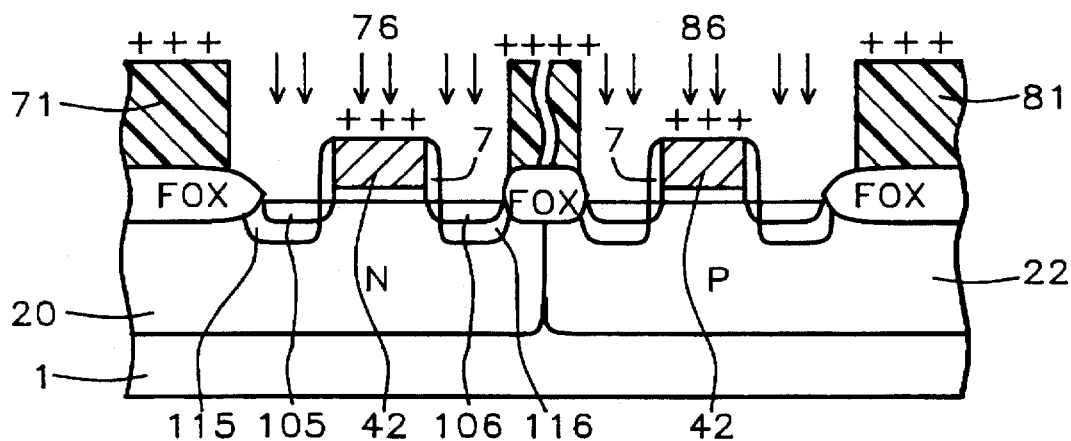
FIG. 1b – Prior Art

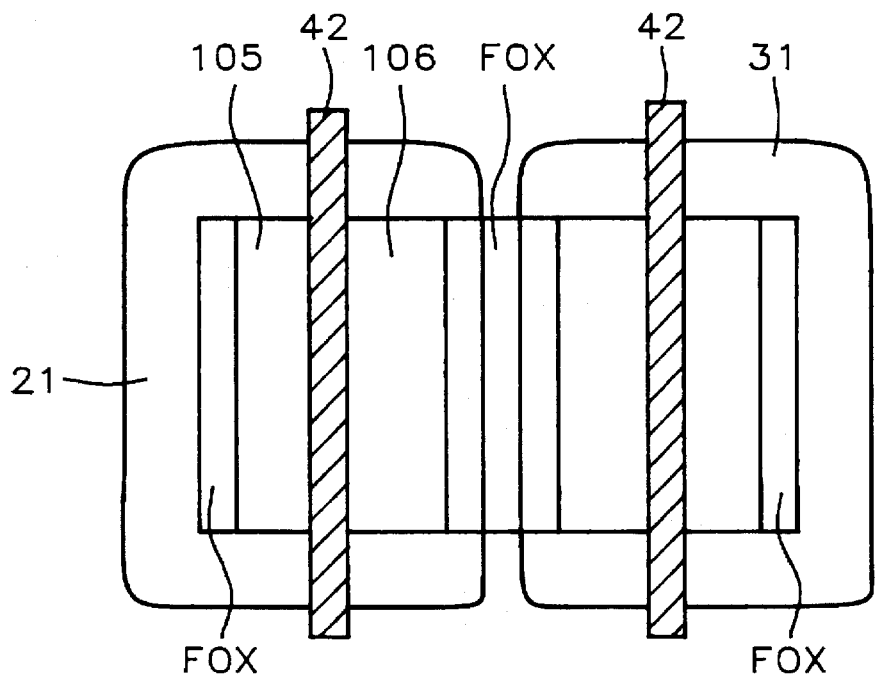
FIG. 2a – Prior Art
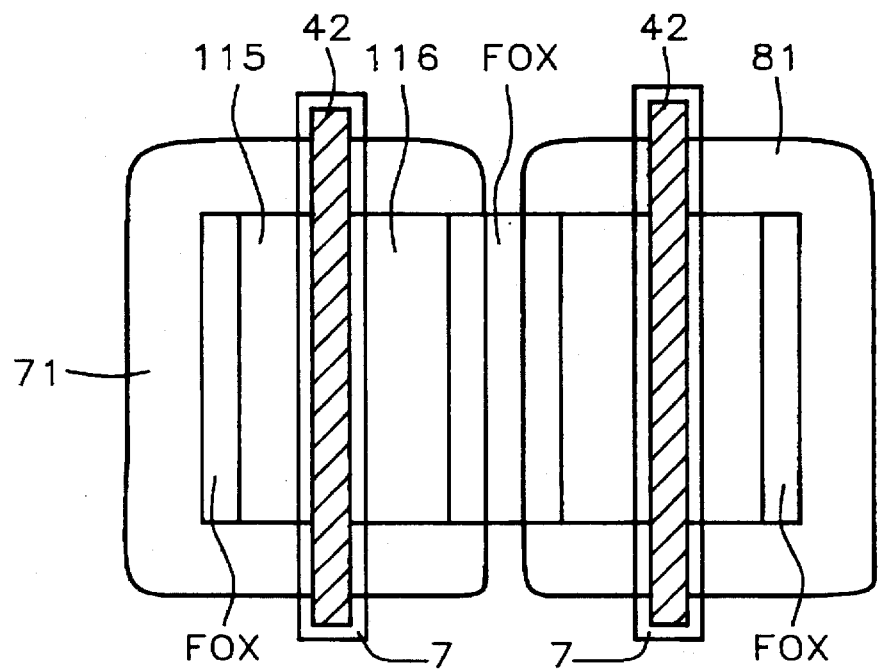
FIG. 2b – Prior Art

MASKED-GATE MOS S/D IMPLANTATION

BACKGROUND OF THE INVENTION (1) Field of the Invention

The invention relates to the general field of semiconductor integrated circuits, more particularly to the manufacture of field effect transistors.

(2) Description of the Prior Art

Ion implantation is commonly used for the formation of the source and drain regions of field effect transistors. For example, during the Positive Lightly Doped Drain (PLDD), Negative Lightly Doped Drain (NLDD), Positive Source/Drain (PS/D), and Negative Source/Drain (NS/D) processes. During ion implantation, positive ions such as $B^+$, $BF^+_2$, $P^+$, and $As^+$, will be implanted, not only into the silicon substrate (to form the source and drain regions) but also into the polysilicon gate electrode. These positive ions can charge up the capacitor structure that is formed by the polygate, gate oxide, and substrate. In some cases the resulting voltage difference across the gate oxide may even lead to its destruction.

The present invention circumvents this difficulty by eliminating this kind of charge-up during PLDD, NLDD, PS/D, and NS/D implantation through suitable protection of the polygate during the implantation process.

An example in the prior art wherein gate protection is provided during ion implantation can be seen in a process described by Liu (U.S. Pat. No. 5,393,682 February 1995). The Liu patent, however, is concerned with thin film transistors and involves a different process and structure from the one that is taught by our invention.

FIG. 1a illustrates the current practice in the prior art when forming the type of structures to which the present invention relates. The example is for CMOS using PLDD and NLDD devices but the same general methodology would apply if PS/D and NS/D devices were being used. N well 21 and P well 22 have been formed in silicon substrate 1. At the surface these two regions are electrically isolated from each other by means of thick layers of Field OXide (FOX), as shown.

Polysilicon gates 42 have been formed in the center of each region and, in separate operations, N well region 21 is implantated with P dopant material 26, such as boron ions, and P well region 22 is implanted with N dopant material 36 such as arsenic ions. During implantation of the N well, the P well is completely covered with photoresist, photoresist mask 21 is used to protect the FOX regions, and polygate 42 is left unprotected.

During implantation of the P well, the N well is completely covered with photoresist, photoresist mask 31 is used to protect the FOX regions, and polygate 42 is left unprotected. Note that oxide layer 11, part of which serves as the gate oxide, extends over the entire surface of the N and P wells. Thus, the depth to which implanted ions 26 and 36 penetrate spans both layer 11 and layers 105 and 106 (for the N well) when forming source and drain regions.

Referring now to FIG. 1b, the process continues with the removal of layer 11 everywhere (except under gate electrode 42) and the formation of oxide spacers 7 on the vertical edges of gate electrodes 42. Two separate ion implant steps, for the N and P wells, are now provided as before. In the absence of oxide layer 11, the ion penetration is limited to the silicon. Additionally, for this step, a greater ion dosage is used. This completes formation of the source and drain regions, as before (shown for the N well as 115 and 116 in FIG. 1b). As before, the well that is not being implanted is completely covered with photoresist, and photoresist masks (71 for the N well and 81 for the P well) are used to protect the FOX regions, but polygate 42 is left unprotected.

FIGS. 2a and 2b are plan views of the cross-sections shown in FIGS. 1a and 1b respectively. Note that the photoresist masks 71 and 81 for the N and P wells respectively, do not cover the polygates 42 in either case.

An important feature of the present invention is that a photoresist cap is used to keep ions from becoming trapped in the gate during ion bombardment. This has the advantage that it can be applied after spacer formation and, furthermore, is readily removed after it has served its function.

Completing our review of the prior art, we note that the use of photoresist as a mask, as opposed to a protective cap, is known. For example Tatsumi (U.S. Pat. No. 5,200,028 April 1993) teaches the use of photoresist for masking a silicon surface during plasma etching. Huang et al. (U.S. Pat. No. 5,354,700) also teach the use of photoresist as a mask during boron ion implantation in a manner similar to that of Liu already discussed above.

SUMMARY OF THE INVENTION

It has therefore been an object of the present invention to provide an ion implantation based process, for manufacturing field effect transistors, without trapping charge during said ion implantation.

It is a further object of the present invention that said process be cheaper to implement than existing prior art processes for achieving the first object.

This has been achieved through use of a protective cap of photoresist which is applied to the gate prior to high energy ion implantation. Said protective cap is readily removed after ion implantation. Precise alignment of the cap with respect to the gate is not necessary.

BRIEF DESCRIPTION OF THE DRAWINGS

FIGS. 1a and 1b show the prior art process for forming an LDD type of FET structure.

FIGS. 2a and 2b are plan views of the cross-sections shown in FIGS. 1a and 1b respectively.

DESCRIPTION OF THE PREFERRED EMBODIMENTS

Figure 3:
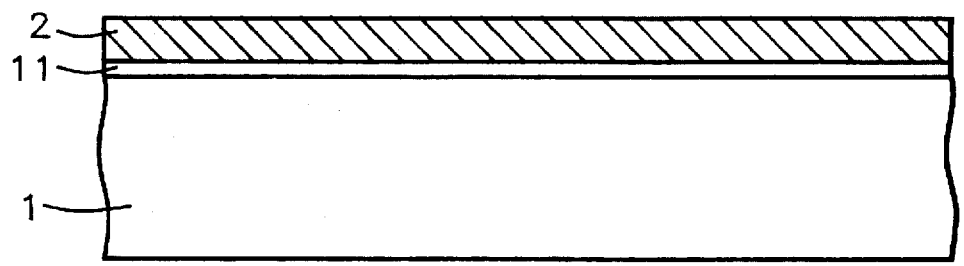
FIGS. 3 through 6 illustrate successive steps of the process of the present invention.

Referring now to FIG. 3, the process of the present invention starts with a body 1 of either P type or N type silicon, as shown, or, alternately, a body of silicon which has been doped P type (and/or N type) to a sufficient depth below the surface (not shown). Also not shown in FIG. 3 are the layers of field oxide (FOX) which provide field isolation between individual devices. Examples of these may be seen in FIGS. 1a, 1b, 2a and 2b. Dielectric layer 11 of silicon oxide or oxide-nitride-oxide (ONO), between about 30 and 200 Angstroms thick, is first grown or deposited on 1. A layer of low resistivity (between about 1 and 100 ohm cm.) polysilicon or polycide 2 is then deposited on 11 to a thickness between about 500 and 5,000 Angstroms.

Figure 4:
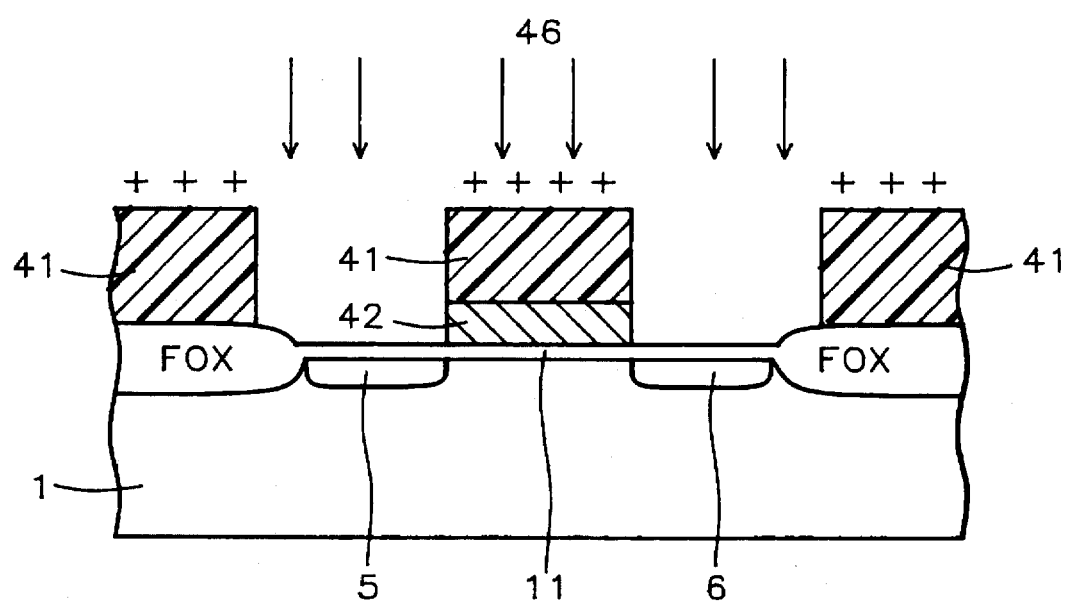

Referring now to FIG. 4, by means of photolithography (not shown), layers 2 are patterned and etched so that they are removed everywhere except in an area that defines a structure comprising a gate 42 having a layer of gate insulation 411 beneath it. In cross-section this has the appearance of a pedestal, as seen in the figure. Typical dimensions for this structure vary with technology but, for 0.5 micron technology, the gate width would be about 0.5 microns. Note that photoresist 41 covers not only the FOX regions but also the polysilicon gate 42. The thickness of the photoresist layer is between 0.5 and 2 microns.

If an NMOS device is being formed, the structure is then implanted with ions of an N type dopant such as arsenic or phosphorus, while if a PMOS device is being formed, P type dopant ions, such as boron or boron fluoride are used. Energetic ions with energies in the range of from about 40 to 100 keV for arsenic and phosphorus and between about 20 and 80 keV for boron and boron fluoride ions, are used for an implanted ion dosage that is typically between about $10^3$ and $10^{14}$ ions/sq. cm. The result is the formation of shallow N, or P, type regions, 5 and 6, the total ion penetration depth being between about 1,000 and 3,000 Angstroms. These regions will serve as part of the source and drain for the finished device. Other processes, not shown here, are used to define the remaining two dimensions of the source and drain.

Regions 5 and 6 are kept shallow so as to reduce the interface capacitance with the gate channel region. They are lightly doped (high resistivity) for the same reason and also to drastically reduce hot electron effects.

Figure 5:
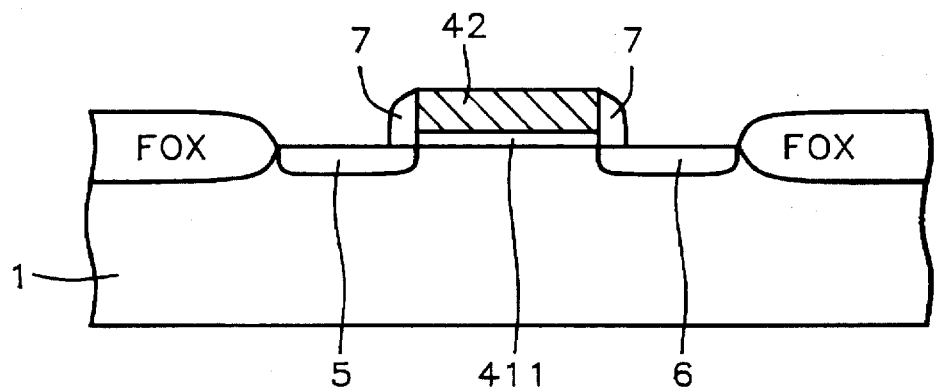

With the lightly doped source and drain regions in place, the conventional, higher dose, source/drain implantation can be done. Prior to this, however, spacers must be formed. Referring now to FIG. 5, the vertical walls of the pedestal are coated with a layer of insulating material such as silicon oxide or silicon nitride to produce spacers 7. To accomplish this, a conformal deposition technique such as chemical vapor deposition is used to coat all surfaces, both horizontal and vertical, to a thickness of between about 500 and 3,000 Angstroms, followed by an anisotropic etching procedure to form the spacers. These spacers are formed of material that will not cause stress or create defect problems for the surrounding devices.

Figure 6:
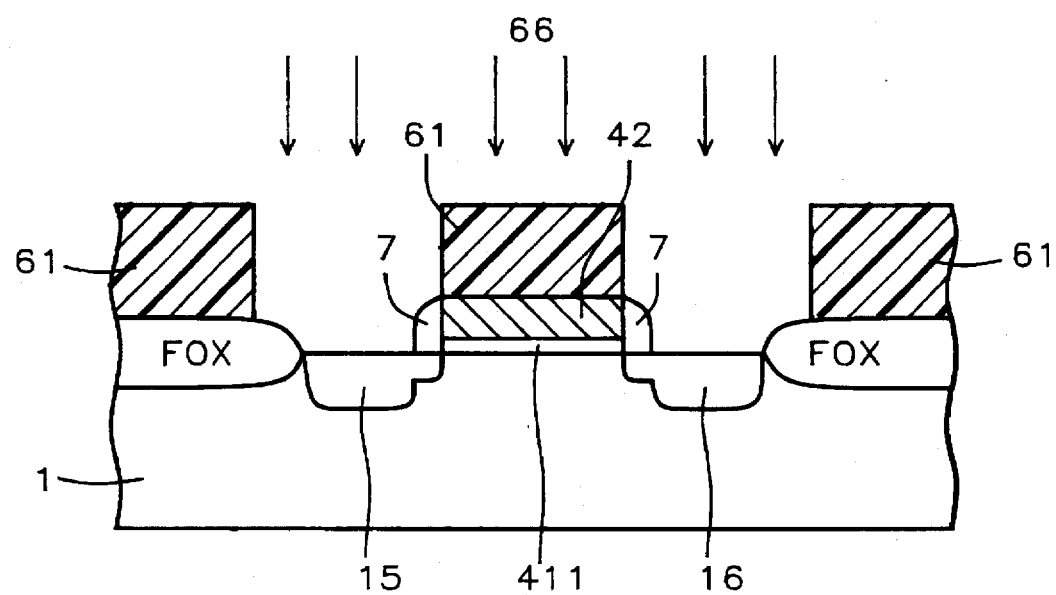

Referring now to FIG. 6, the structure is spin-coated with a layer of photoresist, typically about 1 micron thick, though any thickness between about 0.5 and 2 microns would work. Either a positive or a negative photoresist could be used, although we have preferred to use a negative one. The photoresist is then exposed through a mask and developed so that protective cap 61 is formed.

The LDD process now continues and the structure is subjected to a second ion implantation (shown as 66 in FIG. 6). If the conventional source/drain process was being used this next step would be the first ion implant step. N type dopant material, such as arsenic or phosphorus, and P type dopant material, such as boron or boron fluoride, is implanted into the P and N wells respectively (in separate steps, as before) using energetic ions in the range of from about 40 to 100 keV for arsenic and phosphorus, and in the range of from about 20 to 80 keV for boron, resulting in a layer between about 1,000 and 3,000 Angstroms deep, for a relatively large implanted ion dose of between about $10^4$ and $10^{16}$ ions/sq. cm. The source and drain now have the appearance of regions 15 and 16 respectively in FIG. 6.

Although the ions that were implanted to create the source and drain regions penetrated the protective cap, none will have travelled all the way through to silicon pedestal 42 so the trapping of undesired charge in the gate electrode is thereby avoided. In addition, since the protective cap is an insulating material, any charge trapped in it will not induce an electric field in the gate oxide that is large enough to damage it.

At this point the integrated circuit can be completed in the usual way using standard processing steps such as passivation, via hole etching, aluminum conductor deposition and etching, etc.

We note here that in other embodiments of the present invention, silicon substrates of only a single type (as opposed to both N and P wells on the same substrate) could have been used to produce NMOS or PMOS devices only. Similar ion species, energies, and dosages to those described above for the CMOS process would still be used. The key feature of protecting the gate electrode with a layer of photoresist during ion implantation would still be an integral part of these other possible embodiments.

While the invention has been particularly shown and described with reference to this preferred embodiment, it will be understood by those skilled in the art that various changes in form and details may be made without departing from the spirit and scope of the invention.

What is claimed is:

1. A process for manufacturing a field effect transistor comprising:
   (a) providing a body of silicon of a first conductivity type, having an upper surface wherein are embedded field isolating regions;
   (b) forming a dielectric layer on said upper surface;
   (c) depositing a layer of low resistivity polysilicon on said dielectric layer;
   (d) patterning and etching said polysilicon layer to form a gate structure, having vertical sides;
   (e) coating the gate structure with a layer of photoresist and then patterning said layer of photoresist to form a protective cap, between 0.5 and 2 microns thick, that covers said gate structure;
   (f) implanting dopant ions, of a second conductivity type opposite to said first conductivity type, in a first energy range into said upper surface thereby forming a first layer of the second conductivity type in the upper surface wherever said upper surface is not covered by the gate;
   (g) forming insulating spacers on the vertical sides of said gate structure;
   (h) coating the gate structure with a layer of photoresist and then patterning said layer of photoresist to form a protective cap, between 0.5 and 2 microns thick, that covers said gate structure;
   (i) implanting dopant ions of the second conductivity type in a second energy range into said upper surface whereby a second layer, of the second conductivity type, deeper than said first layer of the second conductivity type, is formed in said upper surface wherever said upper surface is not covered by the gate structure and spacers; and
   (j) then removing said protective cap.

2. The process of claim 1 wherein said dielectric layer comprises silicon oxide or silicon oxide-nitride-oxide.

3. The process of claim 1 wherein the thickness of said dielectric layer is between about 30 and 200 Angstroms.

4. The process of claim 1 wherein the thickness of said layer of polysilicon is between about 500 and 5,000 Angstroms.

5. The process of claim 1 wherein the resistivity of said layer of polysilicon is between about 1 and 100 ohm cm.

6. The process of claim 1 wherein said first conductivity type is P type and said first energy range is from about 40 to 100 kV.

7. The process of claim 1 wherein said first conductivity type is N type and said first energy range is from about 40 to 80 kV.

8. The process of claim 1 wherein the depth of the first layer of second conductivity type is between about 1,000 and 3,000 Angstroms.

9. The process of claim 1 wherein the ion dosage in the first layer of second conductivity type is between about $10^{13}$ and $10^{14}$ ions per sq. cm.

10. The process of claim 1 wherein the thickness of the insulating spacers is between about 500 and 3,000 Angstroms.

11. The process of claim 1 wherein said first conductivity type is P type and said second energy range is from about 40 to 100 kV.

12. The process of claim 1 wherein said first conductivity type is N type and said second energy range is from about 40 to 80 kV.

13. The process of claim 1 wherein the depth of the second layer of second conductivity type is between about 1,000 and 3,000 Angstroms.

14. The process of claim 1 wherein the ion dosage in the second layer of second conductivity type is between about $10^{14}$ and $10^{16}$ ions per sq. cm.

15. A process for manufacturing a field effect transistor comprising:

(a) providing a body of silicon of a first conductivity type, having an upper surface wherein are embedded field isolating regions;

(b) forming a dielectric layer on said upper surface;

(c) depositing a layer of low resistivity polysilicon on said dielectric layer;

(d) patterning and etching said polysilicon and dielectric layers to form a gate structure, having vertical sides, thereby uncovering said upper surface elsewhere;

(e) coating the gate structure with a layer of photoresist and then patterning said layer of photoresist to form a protective cap, between 0.5 and 2 microns thick, that covers said gate structure;

(f) implanting dopant ions, of a second conductivity type opposite to said first conductivity type, in an energy range into said upper surface thereby forming a layer of the second conductivity type in the upper surface wherever said upper surface is not covered by the gate; and (i) then removing said protective cap.

16. The process of claim 15 wherein said dielectric layer comprises silicon oxide or silicon oxide-nitride-oxide.

17. The process of claim 15 wherein the thickness of said dielectric layer is between about 30 and 200 Angstroms.

18. The process of claim 15 wherein the thickness of said layer of polysilicon is between about 500 and 5,000 Angstroms.

19. The process of claim 15 wherein the resistivity of said layer of polysilicon is between about 1 and 100 ohm cm.

20. The process of claim 15 wherein said first conductivity type is P type and said energy range is from about 40 to 100 kV.

21. The process of claim 15 wherein said first conductivity type is N type and said energy range is from about 40 to 80 kV.

22. The process of claim 15 wherein the depth of the layer of second conductivity type is between about 1,000 and 3,000 Angstroms.

23. The process of claim 15 wherein the ion dosage in the layer of second conductivity type is between about $10^{14}$ and $10^{16}$ ions per sq. cm.

* * * * *